US010756513B2

(12) United States Patent
Hagino

(10) Patent No.: US 10,756,513 B2
(45) Date of Patent: Aug. 25, 2020

(54) ATOMIC OSCILLATOR AND FREQUENCY SIGNAL GENERATION SYSTEM

(71) Applicant: Seiko Epson Corporation, Tokyo (JP)

(72) Inventor: Takashi Hagino, Fujimi (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 16/364,264

(22) Filed: Mar. 26, 2019

(65) Prior Publication Data

US 2019/0305515 A1 Oct. 3, 2019

(30) Foreign Application Priority Data

Mar. 27, 2018 (JP) ................................ 2018-060607

(51) Int. Cl.
*H01S 5/0683* (2006.01)
*H01S 5/06* (2006.01)
(Continued)

(52) U.S. Cl.
CPC .......... *H01S 5/06837* (2013.01); *G04F 5/145* (2013.01); *H01S 5/0607* (2013.01); *H03B 17/00* (2013.01); *H03L 7/26* (2013.01)

(58) Field of Classification Search
CPC ... G04F 5/145; G04F 5/14; H03L 7/26; H03B 17/00; H01S 5/06837; H01S 5/0607;
(Continued)

(56) References Cited

U.S. PATENT DOCUMENTS 9,007,136 B2 * 4/2015 Chindo ................... F21V 29/00
331/94.1
2013/0200955 A1 8/2013 Chindo
(Continued)

FOREIGN PATENT DOCUMENTS

| JP | H07-240564 A | 9/1995 |
| JP | 2015-119152 A | 6/2015 |
| JP | 2017-098569 A | 6/2017 |

OTHER PUBLICATIONS

Gerginov, Vladislav, et al. "Atom-based stabilization for laser-pumped atomic clocks." Proceedings of the 20th European Frequency and Time Forum. IEEE, 2006. (Year: 2006).*

(Continued)

*Primary Examiner* — Ryan Johnson
(74) *Attorney, Agent, or Firm* — Harness, Dickey & Pierce, P.L.C.

(57) ABSTRACT

An atomic oscillator includes a semiconductor laser, an atomic cell, a light receiving element, a first temperature control element, and a second temperature control element. The semiconductor laser includes a first mirror layer, a second mirror layer, and an active layer disposed between the first mirror layer, the second mirror layer, and a heat transfer member disposed on the second mirror layer. The atomic cell is irradiated with light emitted from the semiconductor laser. In the atomic cell, an alkali metal atom is accommodated. The light receiving element detects intensity of light transmitted through the atomic cell and outputs a detection signal. The first temperature control element controls a temperature of the semiconductor laser. The second temperature control element is controlled based on the detection signal and is connected to the heat transfer member.

8 Claims, 7 Drawing Sheets

(51) Int. Cl.
*H03L 7/26* (2006.01)
*G03B 17/00* (2006.01)
*G04F 5/14* (2006.01)
*H03B 17/00* (2006.01)

(58) Field of Classification Search
CPC .. H01S 5/0687; H01S 5/02415; H01S 5/0612;
H01S 5/02453
See application file for complete search history.

(56) References Cited

U.S. PATENT DOCUMENTS

2015/0180199 A1  6/2015  Shibata et al.
2015/0180206 A1  6/2015  Imai

OTHER PUBLICATIONS

U.S. Appl. No. 16/34,248, filed Mar. 26, 2019, Takashi Hagino.

\* cited by examiner

ATOMIC OSCILLATOR AND FREQUENCY SIGNAL GENERATION SYSTEM

CROSS-REFERENCE TO RELATED APPLICATIONS

This application claims priority to Japanese Patent Application No. 2018-060607, filed Mar. 27, 2018, the entirety of which is hereby incorporated by reference.

BACKGROUND

1. Technical Field

The present invention relates to an atomic oscillator and a frequency signal generation system.

2. Related Art

In recent years, an atomic oscillator using coherent population trapping (CPT) as one kind of a quantum interference effect is proposed. The atomic oscillator using CPT is an oscillator using an electromagnetically-induced transparency (EIT) phenomenon in which absorption of coherent light is stopped if an alkali metal atom is irradiated with the coherent light having two kinds of wavelengths (frequencies). It is necessary that the wavelength of light emitted from a light source is controlled with high accuracy, in the atomic oscillator using CPT.

A semiconductor laser used as a light source of the atomic oscillator has an oscillation wavelength which fluctuates by temperature fluctuation. Therefore, for example, in an atomic oscillator disclosed in JP-A-2015-119152, temperature fluctuation of a light emitting element is reduced in a manner that a wiring layer on a relay member having a temperature adjusted by a temperature adjustment surface is interposed in the middle of a wiring connecting the light emitting element and an external terminal to each other, so as to reduce temperature fluctuation of the wiring.

As in the atomic oscillator disclosed in JP-A-2015-119152, in a case where the semiconductor laser is used as the light source, it is possible to control the oscillation wavelength by a drive current. However, if the drive current is changed in order to control the oscillation wavelength of the semiconductor laser, a light output of the semiconductor laser is also changed. The change of the light output of the semiconductor laser may cause a light shift, and thus deteriorates frequency stability of the atomic oscillator.

SUMMARY

An aspect of an atomic oscillator according to the invention includes a semiconductor laser, an atomic cell, a light receiving element, a first temperature control element, a heat transfer member, and a second temperature control element. The semiconductor laser includes a first mirror layer, a second mirror layer, and an active layer disposed between the first mirror layer and the second mirror layer. The atomic cell is irradiated with light emitted from the semiconductor laser. In the atomic cell, an alkali metal atom is accommodated. The light receiving element detects intensity of light transmitted through the atomic cell and outputs a detection signal. The first temperature control element controls a temperature of the semiconductor laser. The heat transfer member is disposed on the second mirror layer. The second temperature control element is controlled based on the detection signal and is connected to the heat transfer member.

In the aspect of the atomic oscillator, the second mirror layer may be disposed on the active layer. The heat transfer member may be disposed on an upper surface of the second mirror layer.

In the aspect of the atomic oscillator, the heat transfer member may be an electrode that causes a current to flow into the active layer.

In the aspect of the atomic oscillator, the heat transfer member and the second temperature control element may be connected to each other by a wiring for supplying a current to the heat transfer member.

In the aspect of the atomic oscillator, the second temperature control element and the semiconductor laser may be disposed on a temperature control surface of the first temperature control element.

The aspect of the atomic oscillator may further include a container that accommodates the semiconductor laser, the first temperature control element, and the second temperature control element. The first temperature control element and the second temperature control element may be disposed at positions different from each other in the container.

The aspect of the atomic oscillator may further include a temperature sensor. The first temperature control element may be controlled based on an output of the temperature sensor.

An aspect of a frequency signal generation system according to the invention includes an atomic oscillator. The atomic oscillator includes a semiconductor laser, an atomic cell, a light receiving element, a first temperature control element, a heat transfer member, and a second temperature control element. The semiconductor laser includes a first mirror layer, a second mirror layer, and an active layer disposed between the first mirror layer and the second mirror layer. The atomic cell is irradiated with light emitted from the semiconductor laser. In the atomic cell, an alkali metal atom is accommodated. The light receiving element detects intensity of light transmitted through the atomic cell and outputs a detection signal. The first temperature control element controls a temperature of the semiconductor laser. The heat transfer member is disposed on the second mirror layer. The second temperature control element is controlled based on the detection signal and is connected to the heat transfer member.

BRIEF DESCRIPTION OF THE DRAWINGS

The embodiments will be described with reference to the accompanying drawings, wherein like numbers reference like elements.

DESCRIPTION OF EXEMPLARY EMBODIMENTS

Hereinafter, the preferred embodiment will be described in detail with reference to the drawings. The embodiment described below does not unduly limit the contents of the invention described in the appended claims. Not all configurations described below are necessarily essential components of the invention.

1. Atomic Oscillator

1.1. Configuration of Atomic Oscillator

Figure 1:
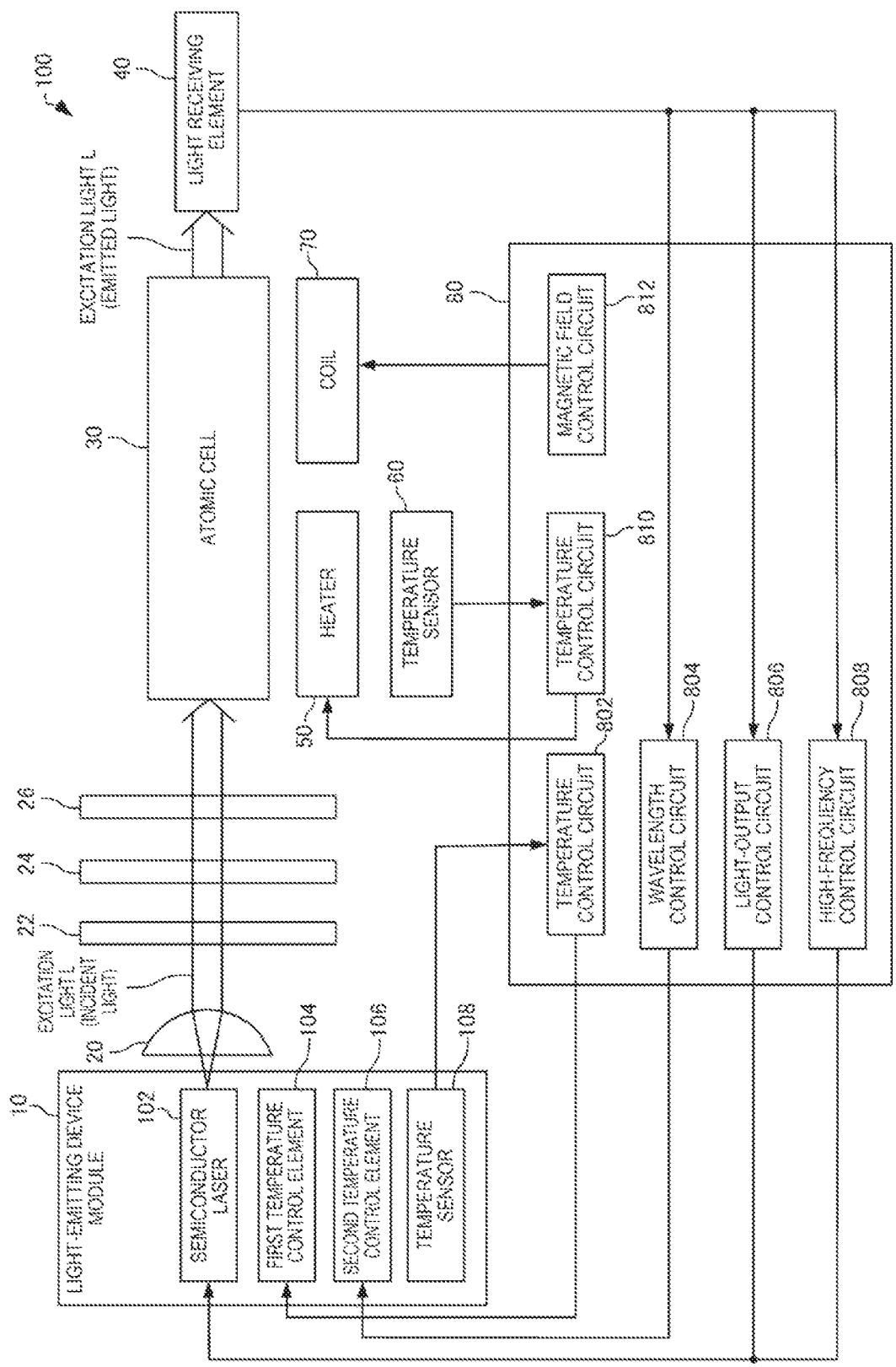
FIG. 1 is a functional block diagram illustrating an atomic oscillator according to an embodiment.
Figure 2:
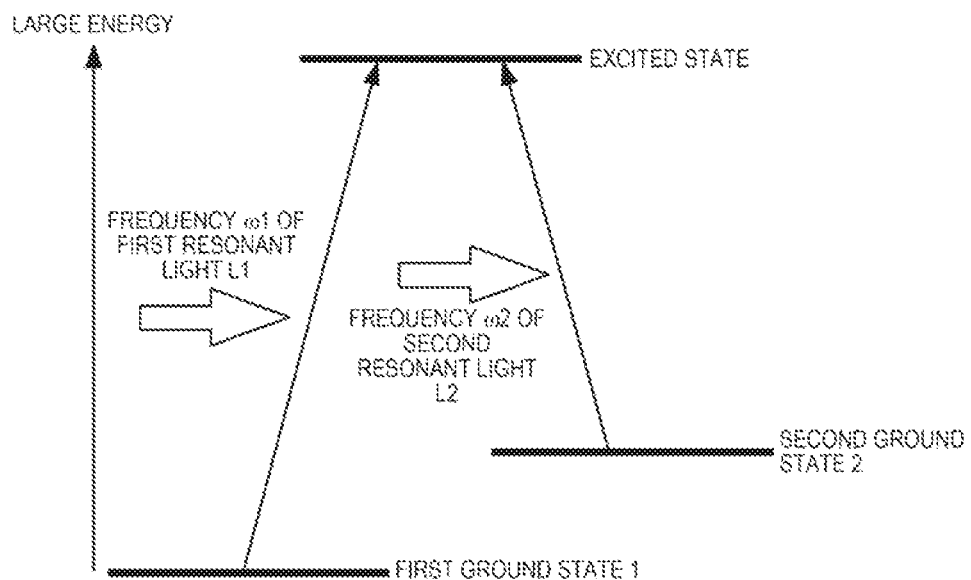
FIG. 2 is a diagram illustrating an energy state of an alkali metal atom in an atomic cell.
Figure 3:
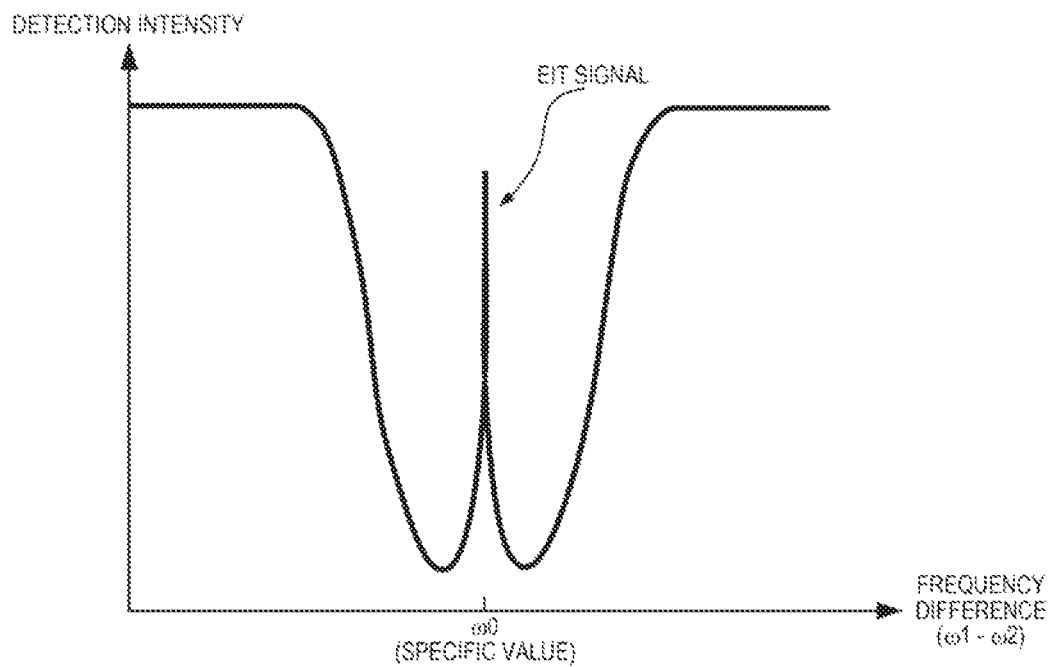
FIG. 3 is a graph illustrating a relation between a frequency difference between two kinds of light emitted from a semiconductor laser and detection intensity detected by a light receiving element.

Firstly, a configuration of an atomic oscillator according to an embodiment will be described with reference to the drawings. FIG. 1 is a functional block diagram illustrating an atomic oscillator 100 according to the embodiment. FIG. 2 is a diagram illustrating an energy state of an alkali metal atom in an atomic cell 30 of the atomic oscillator 100 according to the embodiment. FIG. 3 is a graph illustrating a relation between a frequency difference and detection intensity in the atomic oscillator 100 according to the embodiment. The frequency difference refers to a frequency difference between two kinds of light emitted from a semiconductor laser 102. The detection intensity is detected by a light receiving element 40.

The atomic oscillator 100 uses the quantum interference effect. The atomic oscillator 100 using the quantum interference effect can have a reduced size in comparison to an atomic oscillator using the double resonance effect.

As illustrated in FIG. 1, the atomic oscillator 100 includes a light-emitting device module 10, optical members 20, 22, 24, and 26, an atomic cell 30, a light receiving element 40, a heater 50, a temperature sensor 60, a coil 70, and a controller 80.

Firstly, the principle of the atomic oscillator 100 will be described.

In the atomic oscillator 100, gaseous alkali metal atoms of rubidium, cesium, sodium, and the like are sealed in the atomic cell 30.

As illustrated in FIG. 2, the alkali metal atom has an energy level of a three-level system. The alkali metal atom may be in three states of two ground states (first ground state 1 and second ground state 2) and an excited state. The two ground states have different energy levels. Here, the first ground state 1 is lower than the second ground state 2.

If the gaseous alkali metal atom is irradiated with first resonant light L1 and second resonant light L2 having frequencies different from each other, light absorption rates (light transmittance) of the first resonant light L1 and the second resonant light L2 in the alkali metal atom change depending on a difference ($\omega 1 - \omega 2$) between the frequency $\omega 1$ of the first resonant light L1 and the frequency $\omega 2$ of the second resonant light L2. When the difference ($\omega 1 - \omega 2$) between the frequency $\omega 1$ of the first resonant light L1 and the frequency $\omega 2$ of the second resonant light L2 matches with a frequency corresponding to an energy difference between the first ground state 1 and the second ground state 2, excitation from the ground states 1 and 2 to the excited state is stopped. At this time, neither the first resonant light L1 nor the second resonant light L2 is not absorbed but transmitted through the alkali metal atom. Such a phenomenon is referred to as a CPT phenomenon or an electromagnetically-induced transparency (EIT) phenomenon.

Here, for example, if the frequency $\omega 1$ of the first resonant light L1 is fixed, and the frequency $\omega 2$ of the second resonant light L2 is changed, detection intensity of the light receiving element 40 rapidly increases, as illustrated in FIG. 3, when the difference ($\omega 1 - \omega 2$) between the frequency $\omega 1$ of the first resonant light L1 and the frequency $\omega 2$ of the second resonant light L2 matches with a frequency $\omega 0$ corresponding to an energy difference between the first ground state 1 and the second ground state 2. Such a steep signal is referred to as an EIT signal. The EIT signal has a fixed value which has been determined in accordance with the type of alkali metal atom. Thus, it is possible to realize an oscillator having high accuracy by using the EIT signal as a reference.

Components of the atomic oscillator 100 will be described below.

Light-Emitting Device Module

As illustrated in FIG. 1, the light-emitting device module 10 emits excitation light L causing the alkali metal atom in the atomic cell 30 to be excited. Specifically, the light-emitting device module 10 emits the first resonant light L1 and the second resonant light L2 as the excitation light L.

As illustrated in FIG. 2, the first resonant light L1 causes the alkali metal atom in the atomic cell 30 to be excited from the first ground state 1 to the excited state. The second resonant light L2 causes the alkali metal atom in the atomic cell 30 to be excited from the second ground state 2 to the excited state.

As illustrated in FIG. 1, the light-emitting device module 10 includes a semiconductor laser 102, a first temperature control element 104, a second temperature control element 106, and a temperature sensor 108. Details of the light-emitting device module 10 will be described later.

Optical Member

The optical members 20, 22, 24, and 26 are provided on an optical path of the excitation light L between the light-emitting device module 10 and the atomic cell 30. In the example illustrated in FIG. 1, the first optical member 20, the second optical member 22, the third optical member 24, and the fourth optical member 26 are disposed from the light-emitting device module 10 side toward the atomic cell 30 side in this order.

The first optical member 20 is a lens that makes the excitation light L into parallel light. The second optical member 22 is a polarizing plate that aligns polarized light of the excitation light L from the light-emitting device module 10, in a predetermined direction. The third optical member 24 is a dimming filter that reduces intensity of the excitation light L incident to the atomic cell 30, that is, a neutral density filter (ND filter). The fourth optical member 26 is a λ/4 wave plate. The fourth optical member 26 transforms the excitation light L from the light-emitting device module 10, from linearly-polarized light into circularly-polarized light.

Atomic Cell

The atomic cell 30 is irradiated with the excitation light L emitted from the semiconductor laser 102. In the example in FIG. 1, the atomic cell 30 is irradiated with the excitation light L emitted from the semiconductor laser 102 of the light-emitting device module 10 through the optical members 20, 22, 24, and 26. The gaseous alkali metal atoms are accommodated in the atomic cell 30. If necessary, a rare gas such as argon or neon, an inert gas such as nitrogen may be accommodated as a buffer gas in the atomic cell 30, along with the gaseous alkali metal atom.

Light Receiving Element

The light receiving element 40 detects the intensity of the excitation light L (first resonant light L1 and second resonant light L2) transmitted through the atomic cell 30 and outputs a detection signal depending on the intensity of the light. For example, a photodiode may be used as the light receiving element 40.

Heater

The heater 50 heats the atomic cell 30, more specifically, the alkali metal atoms accommodated in the atomic cell 30. Thus, it is possible to maintain the alkali metal atom in the atomic cell 30 to be in a gaseous state having appropriate density. The heater 50 includes, for example, a heating resistor that is energized so as to generate heat.

Temperature Sensor

The temperature sensor 60 measures the temperature of the heater 50 or the atomic cell 30. The quantity of heat generated by the heater 50 is controlled based on a measurement result of the temperature sensor 60. Thus, it is possible to maintain the temperature of the alkali metal atom in the atomic cell 30 to be a desired temperature. For example, well-known temperature sensors such as a thermistor and a thermocouple may be used as the temperature sensor 60.

Coil

The coil 70 generates a magnetic field that Zeeman-splits a plurality of degenerate energy levels of the alkali metal atom in the atomic cell 30. With the Zeeman splitting, the coil 70 can expand a gap between the degenerate different energy levels of the alkali metal atom so as to improve a resolution. As a result, it is possible to improve accuracy of an oscillation frequency of the atomic oscillator 100.

For example, the coil 70 is a Helmholtz coil disposed so as to sandwich the atomic cell 30, or a solenoid coil disposed so as to cover the atomic cell 30.

Controller

The controller 80 controls the light-emitting device module 10, the heater 50, and the coil 70. The controller 80 includes a temperature control circuit 802, a wavelength control circuit 804, a light-output control circuit 806, and a high-frequency control circuit 808. The controller 80 further includes a temperature control circuit 810 and a magnetic field control circuit 812.

The temperature control circuit 802 controls the first temperature control element 104 based on the measurement result of the temperature sensor 108. Thus, it is possible to adjust the temperature of the semiconductor laser 102 to a desired constant temperature, and to reduce an influence of the ambient temperature on the semiconductor laser 102. The ambient temperature is a temperature around the semiconductor laser 102, which may influence the temperature of the semiconductor laser 102.

The wavelength control circuit 804 controls the oscillation wavelength of the semiconductor laser 102, that is, the center wavelength of the excitation light L by supplying a current to the second temperature control element 106 based on signal intensity of the detection signal output by the light receiving element 40. The wavelength control circuit 804 controls the oscillation wavelength of the semiconductor laser 102 such that the center wavelength of the excitation light L is stabilized at a wavelength corresponding the minimum signal intensity (bottom of absorption) of the detection signal of the light receiving element 40.

As described above, in the atomic oscillator 100, the oscillation wavelength of the semiconductor laser 102 is controlled in a manner that the second temperature control element 106 is controlled based on the detection signal output by the light receiving element 40, and the temperature of the semiconductor laser 102 is controlled by using the second temperature control element 106.

The light-output control circuit 806 controls the light output of the semiconductor laser 102 by supplying a drive current to the semiconductor laser 102 based on the signal intensity of the detection signal output by the light receiving element 40. The light output means intensity of light emitted from the semiconductor laser 102 and means intensity of the light which is emitted from the semiconductor laser 102 in a state before passing through the optical members. The light-output control circuit 806 controls the semiconductor laser 102 such that the light output of the semiconductor laser 102 (light intensity of excitation light L) becomes constant. Specifically, the light-output control circuit 806 controls the light output of the semiconductor laser 102 such that the minimum value (bottom of absorption) of the signal intensity of the detection signal of the light receiving element 40 is set to a predetermined value.

The high-frequency control circuit 808 performs a control of supplying a high-frequency signal to the semiconductor laser 102. The high-frequency control circuit 808 controls the frequency of the high-frequency signal to be a frequency corresponding to the half of ($\omega 1-\omega 2$) of the alkali metal atom.

The temperature control circuit 810 controls energization to the heater 50 based on the measurement result of the temperature sensor 60. Thus, it is possible to maintain the atomic cell 30 to be in a desired temperature range (for example, about 70° C.).

The magnetic field control circuit 812 controls energization to the coil 70 such that the magnetic field generated by the coil 70 becomes constant.

For example, the controller 80 is provided in an integrated circuit (IC) mounted on a substrate (not illustrated).

A processor, for example, a central processing unit (CPU) may be used as the control circuits 802, 804, 806, 808, 810, and 812 constituting the controller 80. That is, the function of the controller 80 may be realized by the processor executing a program stored in a storage device (not illustrated).

1.2. Configuration of Light-Emitting Device Module

Figure 4:
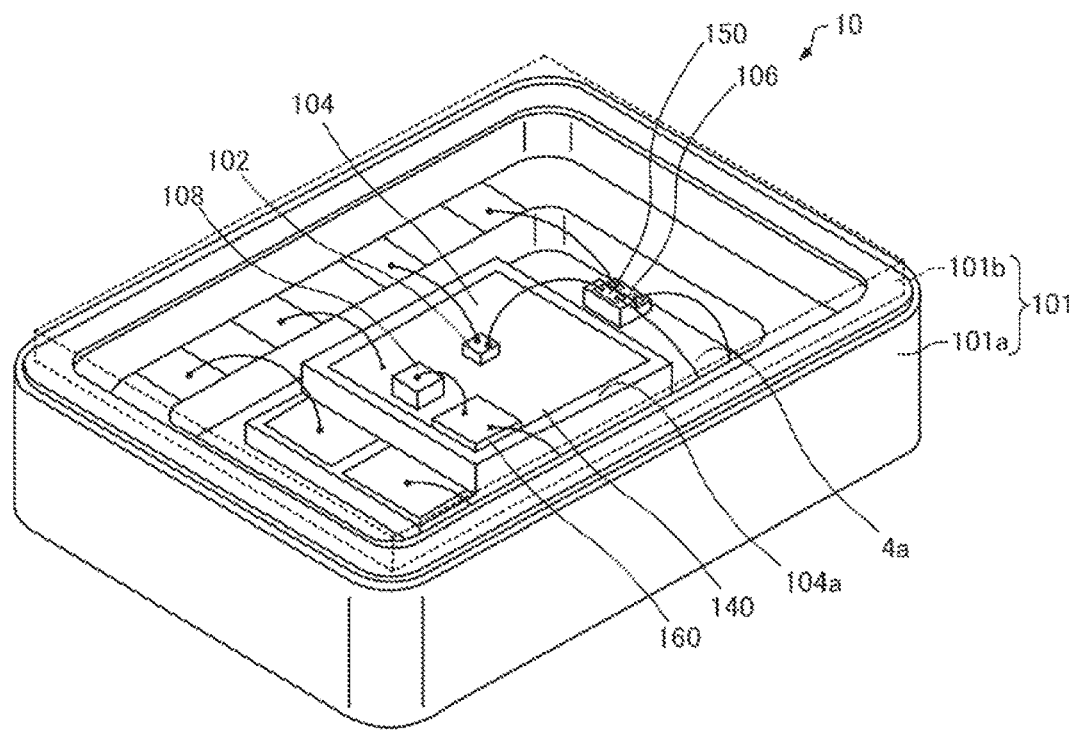
FIG. 4 is a perspective view schematically illustrating a light-emitting device module.
Figure 5:
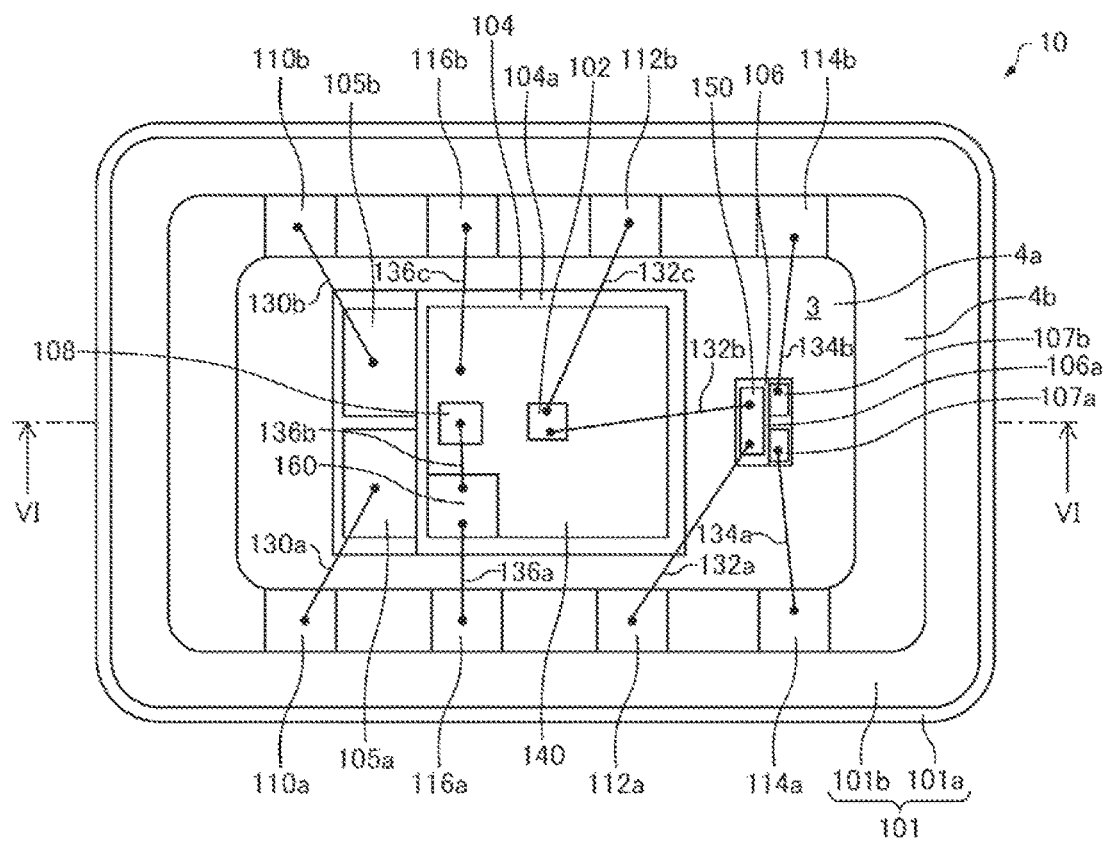
FIG. 5 is a plan view schematically illustrating the light-emitting device module.
Figure 6:
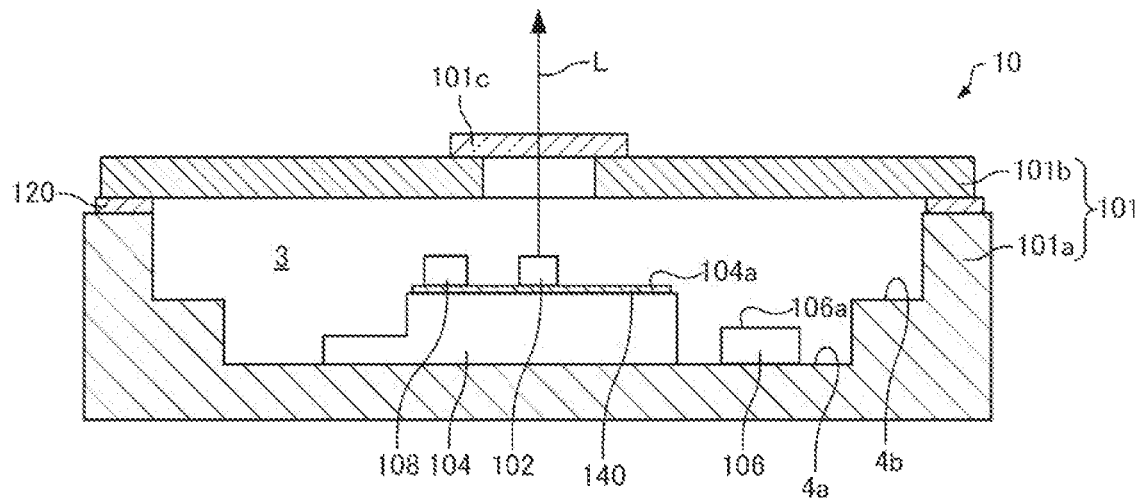
FIG. 6 is a sectional view schematically illustrating the light-emitting device module.

Next, a configuration of the light-emitting device module 10 will be described with reference to the drawings. FIG. 4 is a perspective view schematically illustrating the light-emitting device module 10. FIG. 5 is a plan view schematically illustrating the light-emitting device module 10. FIG. 6 is a sectional view schematically illustrating the light-emitting device module 10. FIG. 6 is a sectional view taken along line VI-VI in FIG. 5. In FIGS. 4 and 5, a lid 101b is transparently illustrated for easy descriptions.

As illustrated in FIGS. 4 to 6, the light-emitting device module 10 includes the semiconductor laser 102, the first temperature control element 104, the second temperature control element 106, and the temperature sensor 108. The light-emitting device module 10 further includes a package 101 as a container for accommodating the semiconductor laser 102, the first temperature control element 104, the second temperature control element 106, and the temperature sensor 108. In this specification, descriptions will be made on the assumption that, regarding a position relation in the light-emitting device module 10, relatively, the lid 101b side is set to be an upper side, and a base 101a side is set to be a lower side.

The package 101 includes the base 101a having a recess portion 3 and the lid 101b configured to close an opening of the recess portion 3. The recess portion 3 closed by the lid 101b functions as an accommodation space for accommodating the semiconductor laser 102, the first temperature control element 104, the second temperature control element 106, and the temperature sensor 108. Preferably, the accommodation space is in a vacuum state, that is, in a state in which the pressure is lower than the atmospheric pressure. Thus, it is possible to reduce fluctuation of an external temperature of the package 101, that is, to reduce an influence of fluctuation of the ambient temperature on the semiconductor laser 102, the temperature sensor 108, or the like in the package 101. The accommodation space may not be in the vacuum state. For example, the accommodation space may be filled with an inert gas such as nitrogen, helium, and argon.

Preferably, the base 101a is formed with a material which has an insulating property and is suitable for making the accommodation space be an air-tight space. Examples of the material of the base 101a include various ceramics such as oxide ceramics (such as alumina, silica, titania, and zirconia), nitride ceramics (such as silicon nitride, aluminum nitride, and titanium nitride), and carbide ceramics (such as silicon carbide). As the material of the base 101a, a metal material similar to that of the lid 101b may be used.

The base 101a has a first surface 4a and a second surface 4b. The first surface 4a is a surface of the base 101a, which serves as the bottom surface of the recess portion 3. The second surface 4b is disposed on an upper side of the first surface 4a. In the example in FIGS. 5 and 6, the second surface 4b is an upper surface of a step portion formed in the base 101a. As illustrated in FIG. 5, a pair of connection electrodes 110a and 110b, a pair of connection electrodes 112a and 112b, a pair of connection electrodes 114a and 114b, and connection electrodes 116a and 116b are disposed on the second surface 4b. The connection electrodes 110a and 110b are electrically connected to the first temperature control element 104. The connection electrodes 112a and 112b are electrically connected to the semiconductor laser 102. The connection electrodes 114a and 114b are electrically connected to the second temperature control element 106. The connection electrodes 116a and 116b are electrically connected to the temperature sensor 108. Although not illustrated, respectively, the connection electrodes 110a, 110b, 112a, 112b, 114a, 114b, 116a, and 116b are electrically connected to external mounted electrodes (not illustrated) provided on a lower surface of the base 101a, that is, on a surface of the base 101a far from the lid 101b, via through electrodes.

The materials of the connection electrodes 110a, 110b, 112a, 112b, 114a, 114b, 116a, and 116b, the external mounted electrode, and the through electrode are not particularly limited. For example, metal materials such as gold, platinum, aluminum, aluminum alloys, nickel, and copper are provided.

A metallized layer 120 having a frame shape is provided on an upper end surface of the base 101a. The metallized layer 120 is used for improving adhesiveness to a brazing material.

The shape of the lid 101b is a flat-plate shape, for example. As illustrated in FIG. 6, a through-hole is formed in the lid 101b. The through-hole is sealed by a window member 101c having permeability for the excitation light L. The lid 101b is bonded to the base 101a with a brazing material by welding with the metallized layer 120.

The material of portions of the lid 101b other than the window member 101c is not particularly limited, and a metal material is desirably used. Among metal materials, a metal material having a linear expansion coefficient which is approximate to that of the constituent material of the base 101a is preferably used. For example, in a case where the base 101a is a ceramic substrate, an alloy such as Kovar is preferably used as the material of the lid 101b.

The window member 101c is disposed on the optical path of the excitation light L emitted from the semiconductor laser 102. The shape of the window member 101c is a plate-shape in the example in FIG. 6. The window member 101c may have a bent surface in order to function as a lens.

The first temperature control element 104 and the second temperature control element 106 are disposed on the base 101a. The first temperature control element 104 and the second temperature control element 106 are disposed at positions different from each other on the base 101a. In the example in FIG. 6, the first temperature control element 104 and the second temperature control element 106 are disposed at different positions on the first surface 4a of the base 101a. That is, the first temperature control element 104 and the second temperature control element 106 do not overlap each other when viewed from a direction perpendicular to the first surface 4a of the base 101a. The first temperature control element 104 and the second temperature control element 106 are spaced from each other. The first temperature control element 104 and the second temperature control element 106 are fixed to the base 101a by an adhesive, for example.

In the descriptions according to this specification, the term "on" is used, for example, on the assumption that a case where the term "on" is used for meaning that "a specific thing (referred to as "A" below) is disposed "on" another specific thing (referred to as "B" below)" includes a case where "A" is directly disposed on "B" and a case where "A" is disposed on "B" with another thing interposed between "A" and "B".

The first temperature control element 104 controls the temperature of the semiconductor laser 102. The first temperature control element 104 is controlled based on the output of the temperature sensor 108 in order to reduce the influence of the ambient temperature on the semiconductor laser 102, such that the temperature of the semiconductor laser 102 is set to be a desired predetermined constant temperature. The first temperature control element 104 is controlled by the temperature control circuit 802.

The first temperature control element 104 is a Peltier element, for example. The first temperature control element 104 has a temperature control surface 104a having a temperature to be controlled. In the first temperature control element 104, the temperature control surface 104a may be set as a surface for heating (heating surface), or the temperature control surface 104a may be set as a surface for absorption (absorption surface). The semiconductor laser 102 and the temperature sensor 108 are disposed on the temperature control surface 104a. The temperature of the temperature control surface 104a can be appropriately set in accordance with characteristics of the semiconductor laser 102. A metal layer 140 formed of, for example, metal such as aluminum, gold, and silver, which has excellent thermal conductivity is disposed on the temperature control surface 104a.

The first temperature control element 104 has a pair of terminals 105a and 105b. The terminal 105a is electrically connected to the connection electrode 110a via a wiring 130a. The terminal 105b is electrically connected to the connection electrode 110b via a wiring 130b. Thus, the first temperature control element 104 can be driven by supplying a current from an external mounted electrode to the pair of terminals 105a and 105b. The wirings 130a and 130b are bonding wires, for example.

The second temperature control element 106 is controlled based on the detection signal output by the light receiving element 40. The second temperature control element 106 is used for controlling the oscillation wavelength of the semiconductor laser 102. The second temperature control element 106 is controlled by the wavelength control circuit 804.

The second temperature control element 106 is a Peltier element, for example. The second temperature control element 106 has a temperature control surface 106a having a temperature to be controlled. In the second temperature control element 106, the temperature control surface 106a may be set as a surface for heating (heating surface), or the temperature control surface 106a may be set as a surface for absorption (absorption surface). A metal layer 150 is disposed on the temperature control surface 106a.

Figure 7:
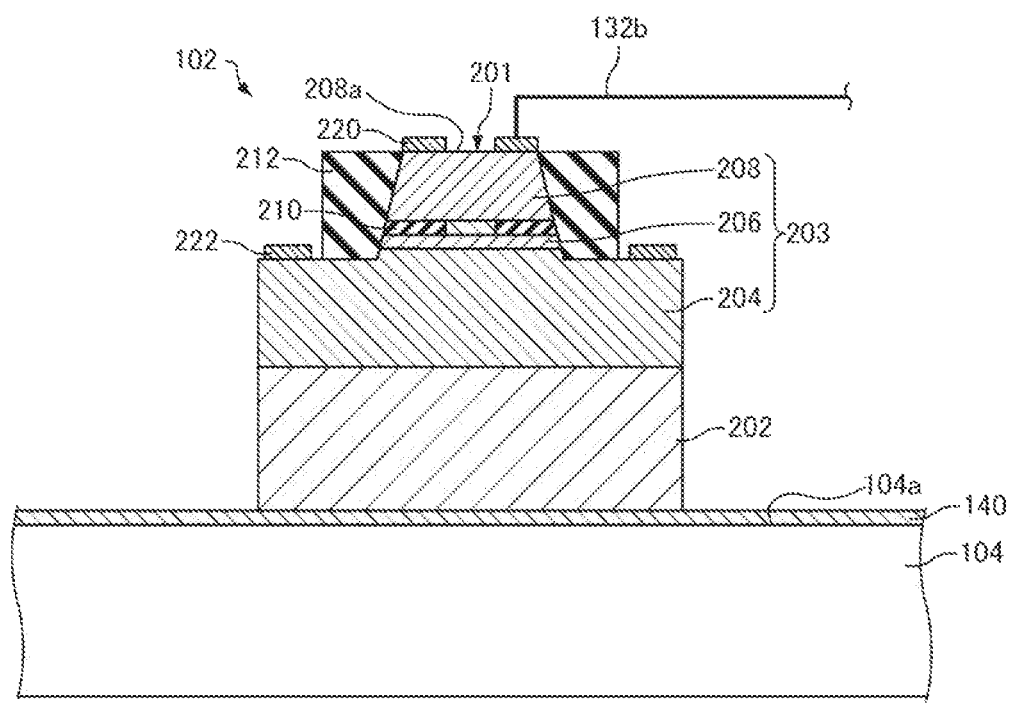
FIG. 7 is a sectional view schematically illustrating the semiconductor laser.

The second temperature control element 106 is connected to the semiconductor laser 102. More specifically, the second temperature control element 106 is connected to a first electrode 220 as a heat transfer member of the semiconductor laser 102, which will be described later and is illustrated in FIG. 7. In the example illustrated in FIG. 5, the second temperature control element 106 and the semiconductor laser 102 are connected to each other via the wiring 132b and the metal layer 150.

The metal layer 150 constitutes a wiring for electrically connecting the connection electrode 112a and the semiconductor laser 102 to each other. In the example illustrated in FIG. 5, the connection electrode 112a and the metal layer 150 are connected to each other by the wiring 132a. The metal layer 150 and the semiconductor laser 102 are connected to each other by the wiring 132b. That is, the semiconductor laser 102 and the connection electrode 112a are electrically connected to each other via the wiring 132a, the metal layer 150, and the wiring 132b. As described above, the metal layer 150 is interposed in the middle of a wiring that connects the semiconductor laser 102 and the connection electrode 112a to each other, that is, interposed between the wiring 132a and the wiring 132b. Thus, the wiring 132b can be thermally connected to the temperature control surface 106a of the second temperature control element 106. Therefore, it is possible to supply heat generated in the second temperature control element 106 to the first electrode 220 of the semiconductor laser 102, which will be described later and is illustrated in FIG. 7, via the wiring 132b.

The metal layer 150 is formed of, for example, metal such as aluminum, gold, and silver, which is excellent in thermal conductivity and electrical conductivity. The wirings 132a and 132b are bonding wires, for example.

The second temperature control element 106 has a pair of terminals 107a and 107b. The terminal 107a is electrically connected to the connection electrode 114a via a wiring 134a. The terminal 107b is electrically connected to the connection electrode 114b via a wiring 134b. Thus, the second temperature control element 106 can be driven by supplying a current to the pair of terminals 107a and 107b from an external mounted electrode. The wirings 134a and 134b are bonding wires, for example.

As described above, in the atomic oscillator 100, the oscillation wavelength of the semiconductor laser 102 is controlled by controlling the temperature of the semiconductor laser 102 with the second temperature control element 106. Therefore, the second temperature control element 106 is preferably capable of controlling the temperature of the semiconductor laser 102 at a high speed such that a feedback control for stabilizing the center wavelength of the excitation light L, which will be described later, to be a wavelength corresponding to the bottom of absorption. In other words, preferably, the temperature of the semiconductor laser 102 can be changed for a relatively short period.

Therefore, the size of the second temperature control element 106 is smaller than the size of the first temperature control element 104. Here, the temperature control element such as a Peltier element or a heater has control responsiveness which is generally improved as the heat capacity becomes smaller. Thus, it is possible to control the temperature of the semiconductor laser 102 by controlling the temperature of the semiconductor laser 102 with the second temperature control element 106, in comparison to a case using the first temperature control element 104. As described above, in the light-emitting device module 10, since a temperature control element having a size which is smaller than the first temperature control element 104 is used as the second temperature control element 106, it is possible to reduce heat capacity of the second temperature control element 106 and to control the temperature of the semiconductor laser 102 at a high speed.

The second temperature control element 106 is not limited to a Peltier element. For example, the second temperature control element 106 may be a heater. In this case, it is possible to lower the temperature of the semiconductor laser 102 in a manner that the temperature of the second temperature control element 106 is controlled to be higher than the temperature of the temperature control surface 104a of the first temperature control element 104.

The temperature sensor 108 is disposed on the temperature control surface 104a of the first temperature control element 104. In the example in FIG. 6, the temperature sensor 108 is disposed on the temperature control surface 104a via the metal layer 140. Although not illustrated, the temperature sensor 108 may be directly disposed on the temperature control surface 104a. The temperature sensor 108 measures the temperature of the first temperature control element 104 or the semiconductor laser 102. For example, a thermistor and a thermocouple may be used as the temperature sensor 108. In the example in FIG. 6, the semiconductor laser 102 and the temperature sensor 108 are disposed on the same metal layer 140. Therefore, it is possible to transfer heat to the semiconductor laser 102 and the temperature sensor 108 with high efficiency and to reduce a temperature difference between the semiconductor laser 102 and the temperature sensor 108.

Although not illustrated, the temperature sensor 108 has a pair of terminals. One terminal of the pair of terminals is a terminal for the detection signal. The other terminal is a terminal for ground. As illustrated in FIG. 5, the terminal for the detection signal is electrically connected to the connection electrode 116a via a wiring 136b, a wiring layer (not illustrated) provided in a relay member 160, and a wiring 136a. The terminal for ground is electrically connected to the connection electrode 116b via the metal layer 140 and a wiring 136c. The wirings 136a, 136b, and 136c are bonding wires, for example.

The relay member 160 has an insulating property. The material of the relay member 160 is ceramics, for example. The wiring layer provided in the relay member 160 is interposed in the middle of a wiring that connects the temperature sensor 108 and the connection electrode 116a to each other, that is, interposed between the wiring 136a and the wiring 136b. Thus, the wirings 136a and 136b can be thermally connected to the temperature control surface 104a of the first temperature control element 104, and thus to reduce the temperature fluctuation of the wirings 136a and 136b.

The semiconductor laser 102 is disposed on the temperature control surface 104a of the first temperature control element 104. In the example in FIG. 6, the semiconductor laser 102 is disposed on the temperature control surface 104a via the metal layer 140. Although not illustrated, the semiconductor laser 102 may be directly disposed on the temperature control surface 104a.

For example, the semiconductor laser 102 is a vertical cavity surface emitting laser (VCSEL). The semiconductor laser 102 emits the first resonant light L1 and the second resonant light L2 described above, as the excitation light L by using the resultant of superimposing a high-frequency signal on a DC bias current.

The semiconductor laser 102 includes a first electrode 220 and a second electrode 222 which will be described later and are illustrated in FIG. 7. The first electrode 220 is electrically connected to the connection electrode 112a via the wiring 132b, the metal layer 150, and the wiring 132a. The second electrode 222 is electrically connected to the connection electrode 112b via a wiring 132c. Thus, the semiconductor laser 102 can be driven by supplying the drive current to the first electrode 220 and the second electrode 222 from an external mounted electrode.

FIG. 7 is a sectional view schematically illustrating the semiconductor laser 102. In this specification, descriptions will be made on the assumption that, regarding a position relation in the semiconductor laser 102, relatively, the first electrode 220 side is set to be an upper side, and a substrate 202 side is set to be a lower side.

As illustrated in FIG. 7, the semiconductor laser 102 includes the substrate 202, a first mirror layer 204, an active layer 206, a second mirror layer 208, a current confinement layer 210, an insulation layer 212, the first electrode 220, and the second electrode 222.

The substrate 202 is disposed on the temperature control surface 104a of the first temperature control element 104 via the metal layer 140. The substrate 202 is a GaAs substrate of a first conductive type (for example, n-type), for example.

The first mirror layer 204 is disposed on the substrate 202. For example, the first mirror layer 204 is an n-type semiconductor layer. The first mirror layer 204 is a distributed Bragg reflector (DBR) mirror. The first mirror layer 204 is configured in a manner that a high-refractive index layer and a low-refractive index layer are alternately stacked. The high-refractive index layer is, for example, an n-type Al0.12Ga0.88As layer in which silicon has been doped. The low-refractive index layer is, for example, an n-type Al0.9Ga0.1As layer in which silicon has been doped. The number (number of pairs) of stacked high-refractive index layers and low-refractive index layers is from 10 pairs to 50 pairs, for example.

The active layer 206 is disposed on the first mirror layer 204. The active layer 206 is disposed between the first mirror layer 204 and the second mirror layer 208. For example, the active layer 206 has a multi-quantum well (MQW) structure in which three quantum well structures are stacked. The quantum well structure is configured with an i-type In0.06Ga0.94As layer and an i-type Al0.3Ga0.7As layer.

The second mirror layer 208 is disposed on the active layer 206. For example, the second mirror layer 208 is a p-type semiconductor layer. The second mirror layer 208 is a distributed Bragg reflector (DBR) mirror. The second mirror layer 208 is configured in a manner that a high-refractive index layer and a low-refractive index layer are alternately stacked. The high-refractive index layer is, for example, a p-type Al0.12Ga0.88As layer in which carbon has been doped. The low-refractive index layer is, for example, a p-type Al0.9Ga0.1As layer in which carbon has been doped. The number (number of pairs) of stacked high-refractive index layers and low-refractive index layers is from 3 pairs to 40 pairs, for example.

The second mirror layer 208, the active layer 206, and the first mirror layer 204 constitute a resonator 203. The second mirror layer 208, the active layer 206, and the first mirror layer 204 constitute a pin diode of a vertical resonator type. If a voltage is applied between the electrodes 220 and 222 in a forward direction of the pin diode, electrons and holes in the active layer 206 are recombined, and thus light is emitted. Light emitted in the active layer 206 reciprocates (is multiply reflected) between the first mirror layer 204 and the second mirror layer 208. Stimulated emission occurs at this time, and thus the intensity is amplified. If an optical gain exceeds an optical loss, laser oscillation is caused, and thereby laser light is emitted from an upper surface of the second mirror layer 208.

The active layer 206, the second mirror layer 208, and the current confinement layer 210 constitute a columnar portion 201. The columnar portion 201 is surrounded by the insulation layer 212. For example, the columnar portion 201 is disposed on the first mirror layer 204 and protrudes upward from the first mirror layer 204.

The current confinement layer 210 is disposed between the first mirror layer 204 and the second mirror layer 208. For example, the current confinement layer 210 may be disposed on the active layer 206 or may be disposed in the second mirror layer 208. The current confinement layer 210 is, for example, a layer obtained by oxidizing a AlxGa1-xAs layer (x≥0.95). The current confinement layer 210 has an opening portion functioning as a current path. With the current confinement layer 210, it is possible to prevent an occurrence of a situation in which a current flowing into the active layer 206 spreads in a planar direction, that is, in a direction orthogonal to a stacked direction of the first mirror layer 204 and the active layer 206.

The insulation layer 212 is disposed in the resonator 203. In the example illustrated in FIG. 7, the insulation layer 212 is disposed on a side surface of the columnar portion 201 and an upper surface of the first mirror layer 204. The insulation layer 212 is disposed to cover the entirety of the side surface of the columnar portion 201. For example, when viewed from the stacked direction of the first mirror layer 204 and the active layer 206, the insulation layer 212 surrounds the columnar portion 201. The insulation layer 212 is, for example, a polyimide layer.

The first electrode 220 is disposed on the second mirror layer 208. In the example in FIG. 7, the first electrode 220 is disposed on an upper surface 208a of the second mirror layer 208. The upper surface 208a of the second mirror layer 208 is a surface on an opposite side of the surface of the second mirror layer 208 on the active layer 206 side. The first electrode 220 may be disposed on a contact layer (not illustrated) disposed on the second mirror layer 208. The first electrode 220 is electrically connected to the second mirror layer 208. For example, a stacked layer obtained by stacking a Cr layer, a Pt layer, a Ti layer, a Pt layer, and an Au layer from the second mirror layer 208 side in this order is used as the first electrode 220. The first electrode 220 is one electrode for causing a current to flow into the active layer 206.

The wiring 132b is connected to the first electrode 220. The wiring 132b has a function as a wiring for supplying a current to the first electrode 220 and has a function to supply heat generated in the second temperature control element 106 to the first electrode 220. Therefore, the first electrode 220 can function as a heat transfer member that transfers heat generated in the second temperature control element 106 to the second mirror layer 208.

Heat generated by the second temperature control element 106 is supplied to the first electrode 220 as the heat transfer member via the wiring 132b. The first electrode 220 can heat or cool the second mirror layer 208 by transferring the heat supplied from the second temperature control element 106, to the second mirror layer 208.

In the semiconductor laser 102, temperature distribution in the resonator 203 changes by heating or cooling the second mirror layer 208. As a result, the length of the resonator changes, and the oscillation wavelength of the semiconductor laser 102 changes. Specifically, if the temperature of the second mirror layer 208 increases, the oscillation wavelength increases. If the temperature of the second mirror layer 208 decreases, the oscillation wavelength decreases.

In the light-emitting device module 10, the first electrode 220 as the heat transfer member is disposed on the second mirror layer 208. Thus, it is possible to partially heat or cool the second mirror layer 208. Therefore, it is possible to reduce temperature fluctuation of the active layer 206, for example, in comparison to a case where the second mirror layer 208 is heated or cooled by the first temperature control element 104.

Here, if the temperature of the active layer 206 fluctuates, a band gap changes, and a light emission gain changes. Thus, the light output of the semiconductor laser 102 fluctuates. The change of the light output of the semiconductor laser 102 causes a light shift, and thus deteriorates frequency stability of the atomic oscillator.

As described above, in the light-emitting device module 10, it is possible to reduce temperature fluctuation of the active layer 206 and to realize an atomic oscillator having excellent frequency stability.

Further, in the light-emitting device module 10, it is possible to partially heat or cool the second mirror layer 208 by the first electrode 220 as the heat transfer member. Thus, it is possible to control the temperature of the second mirror layer 208 at a high speed, for example, in comparison to a case where the second mirror layer 208 is heated or cooled by using the first temperature control element 104. Thus, in the atomic oscillator 100, it is possible to control the oscillation wavelength of the semiconductor laser 102 at a high speed. Thus, it is possible to easily realize the feedback control for stabilizing the center wavelength (described later) of the excitation light L to be the wavelength corresponding to the bottom of absorption.

The second electrode 222 is disposed on the first mirror layer 204. The second electrode 222 is disposed in a region of the first mirror layer 204 except for a region in which the columnar portion 201 has been formed and a region in which the insulation layer 212 has been disposed. The second electrode 222 may be disposed on a contact layer (not illustrated) disposed on the first mirror layer 204. The second electrode 222 is electrically connected to the first mirror layer 204. For example, a stacked layer obtained by stacking a Cr layer, a Pt layer, a Ti layer, a Pt layer, and an Au layer from the first mirror layer 204 side in this order is used as the second electrode 222. The second electrode 222 is the other electrode for causing the current to flow into the active layer 206.

The above descriptions are made on the assumption that the AlGaAs-based surface emitting laser is provided as the semiconductor laser 102. However, a surface emitting laser using a semiconductor material of a GaInP type, a ZnSSe type, an InGaN type, an AlGaN type, an InGaAs type, a GaInNAs type, and a GaAsSb type may be provided as the semiconductor laser 102.

1.3. Operation of Atomic Oscillator

Next, an operation of the atomic oscillator 100 will be described. Firstly, an initial operation when the stopped atomic oscillator 100 is activated will be described.

The light-output control circuit 806 changes the light output of the semiconductor laser 102 based on the signal intensity of a detection signal output by the light receiving element 40. Specifically, the light-output control circuit 806 changes the light output of the semiconductor laser 102 such that the minimum value (bottom of absorption) of the signal intensity of the detection signal when the center wavelength of the excitation light L varies becomes a predetermined value.

Then, the high-frequency control circuit 808 inputs a high-frequency signal to the semiconductor laser 102. At this time, the frequency of the high-frequency signal is slightly shifted such that the EIT phenomenon does not occur. For example, in a case where cesium is used as the alkali metal atom in the atomic cell 30, the frequency of the high-frequency signal is shifted from 4.596 GHz.

Then, the wavelength control circuit 804 sweeps the center wavelength of the excitation light L. At this time, since the frequency of the high-frequency signal is set to an extent that the EIT phenomenon does not occur, the EIT phenomenon does not occur. The wavelength control circuit 804 detects the minimum value (bottom of absorption) of the signal intensity of the detection signal output from the light receiving element 40 when the center wavelength of the excitation light L is swept. For example, the wavelength control circuit 804 sets a value of when the change of the signal intensity of the detection signal is equal to or less than a predetermined ratio with respect to the center wavelength of the excitation light L, as the bottom of absorption.

If the bottom of absorption is detected, the wavelength control circuit 804 fixes (locks) the center wavelength of the excitation light L. That is, the wavelength control circuit 804 fixes the center wavelength of the excitation light L to be a wavelength corresponding to the bottom of absorption.

Then, the high-frequency control circuit 808 adjusts the frequency of the high-frequency signal to be a frequency at which the EIT phenomenon occurs. Then, a loop operation is performed, and thereby, the high-frequency control circuit 808 detects an EIT signal by synchronously detecting the detection signal output by the light receiving element 40.

Next, a loop operation of the atomic oscillator 100 will be described.

The high-frequency control circuit 808 detects the EIT signal by synchronously detecting the detection signal output by the light receiving element 40 and controls the frequency of the high-frequency signal to be a frequency corresponding to the half of ($\omega 1 - \omega 2$) of the alkali metal atom in the atomic cell 30.

The wavelength control circuit 804 performs a feedback control for stabilizing the center wavelength of the excitation light L to be the wavelength corresponding to the bottom of absorption. Specifically, the wavelength control circuit 804 synchronously detects the detection signal output by the light receiving element 40 and controls the second temperature control element 106 so as to set the center wavelength of the excitation light L to be the wavelength corresponding to the bottom of absorption.

The light-output control circuit 806 performs a feedback control to cause the light output of the semiconductor laser 102 to be constant. For example, the light-output control circuit 806 synchronously detects the detection signal output by the light receiving element 40. In a case where the minimum value (bottom of absorption) of the signal intensity of the detection signal is smaller than a predetermined value, the light-output control circuit supplies a drive current to the semiconductor laser 102 so as to set the minimum value (bottom of absorption) of the signal intensity of the detection signal to reach the predetermined value. Even though the center wavelength of the excitation light L is shifted from the wavelength corresponding to the bottom of absorption by the control of the light-output control circuit 806, it is possible to match the center wavelength of the excitation light L with the wavelength of the bottom of absorption by the control of the wavelength control circuit 804.

The atomic oscillator 100 has effects as follows, for example.

The atomic oscillator 100 controls the oscillation wavelength of the semiconductor laser 102 by controlling the temperature of the second mirror layer 208. Therefore, in the atomic oscillator 100, it is possible to separately control the oscillation wavelength of the semiconductor laser 102 and the light output of the semiconductor laser 102. Thus, it is possible to reduce the occurrence of a situation in which the light output of the semiconductor laser 102 fluctuates by controlling the oscillation wavelength of the semiconductor laser 102, for example, in comparison to a case where the oscillation wavelength of the semiconductor laser 102 is controlled with the drive current.

Here, in a case where the oscillation wavelength of the semiconductor laser 102 is caused to fluctuate at the temperature of the semiconductor laser 102, the degree of fluctuation of the light output of the semiconductor laser 102 is much smaller than, for example, that in a case where the oscillation wavelength of the semiconductor laser 102 is caused to fluctuate by the drive current. Therefore, it is possible to reduce the occurrence of a situation in which the light output of the semiconductor laser 102 fluctuates by controlling the oscillation wavelength of the semiconductor laser 102, by controlling the oscillation wavelength of the semiconductor laser 102 at the temperature of the semiconductor laser 102.

Further, in the atomic oscillator 100, the first electrode 220 as the heat transfer member is disposed on the second mirror layer 208. Therefore, in the atomic oscillator 100, it is possible to partially heat or cool the second mirror layer 208. Thus, it is possible to reduce temperature fluctuation of the active layer 206, for example, in comparison to a case where the second mirror layer 208 is heated by the first temperature control element 104. Accordingly, it is possible to realize an atomic oscillator having excellent frequency stability.

In the atomic oscillator 100, the first electrode 220 as the heat transfer member is disposed on the upper surface 208a of the second mirror layer 208. Therefore, in the atomic oscillator 100, it is possible to increase a distance between the first electrode 220 and the active layer 206, for example, in comparison to a case where the heat transfer member is disposed on the side surface of the second mirror layer 208. Therefore, in the atomic oscillator 100, it is possible to reduce temperature fluctuation of the active layer 206 and to realize an atomic oscillator having excellent frequency stability.

In the atomic oscillator 100, the first electrode 220 has a function to cause a current to flow into the active layer 206 and has a function as the heat transfer member that transfers heat to the second mirror layer 208. Therefore, in the atomic oscillator 100, since it is not necessary that a new heat transfer member is provided, it is possible to reduce the number of components in the device and to simplify the device.

In the atomic oscillator 100, the first electrode 220 as the heat transfer member and the second temperature control element 106 are connected to the wiring 132b for supplying a current to the first electrode 220. Therefore, in the atomic oscillator 100, since it is not necessary that a member that supplies heat generated in the second temperature control element 106 to the first electrode 220 as the heat transfer member is provided, it is possible to reduce the number of components in the device and to simplify the device.

In the atomic oscillator 100, the first temperature control element 104 and the second temperature control element 106 are disposed at different positions in the base 101a. Therefore, in the atomic oscillator 100, it is possible to reduce an influence of temperature fluctuation of the first temperature control element 104 on the second temperature control element 106, for example, in comparison to a case where the second temperature control element 106 is disposed on the first temperature control element 104. Thus, it is possible to control the second temperature control element 106 with high efficiency, separately from the first temperature control element 104.

In the atomic oscillator 100, the first temperature control element 104 is controlled based on the output of the temperature sensor 108 such that the semiconductor laser 102 has a desired constant temperature. Therefore, in the atomic oscillator 100, it is possible to reduce an influence of the ambient temperature and to realize an atomic oscillator having excellent frequency stability.

In the above descriptions, a case where the atomic oscillator 100 is an atomic oscillator using CPT is described. However, the atomic oscillator 100 may be an atomic oscillator using Ramsey resonance which occurs by irradiating the atomic cell 30 with pulsed light.

1.4. Modification Example of Atomic Oscillator

Next, modification examples of the atomic oscillator according to the embodiment will be described. In the modification examples described below, members having functions similar to those of the constituent members of the above-described atomic oscillator 100 are denoted by the same reference signs, and detailed descriptions thereof will not be repeated.

1.4.1. First Modification Example

Figure 8:
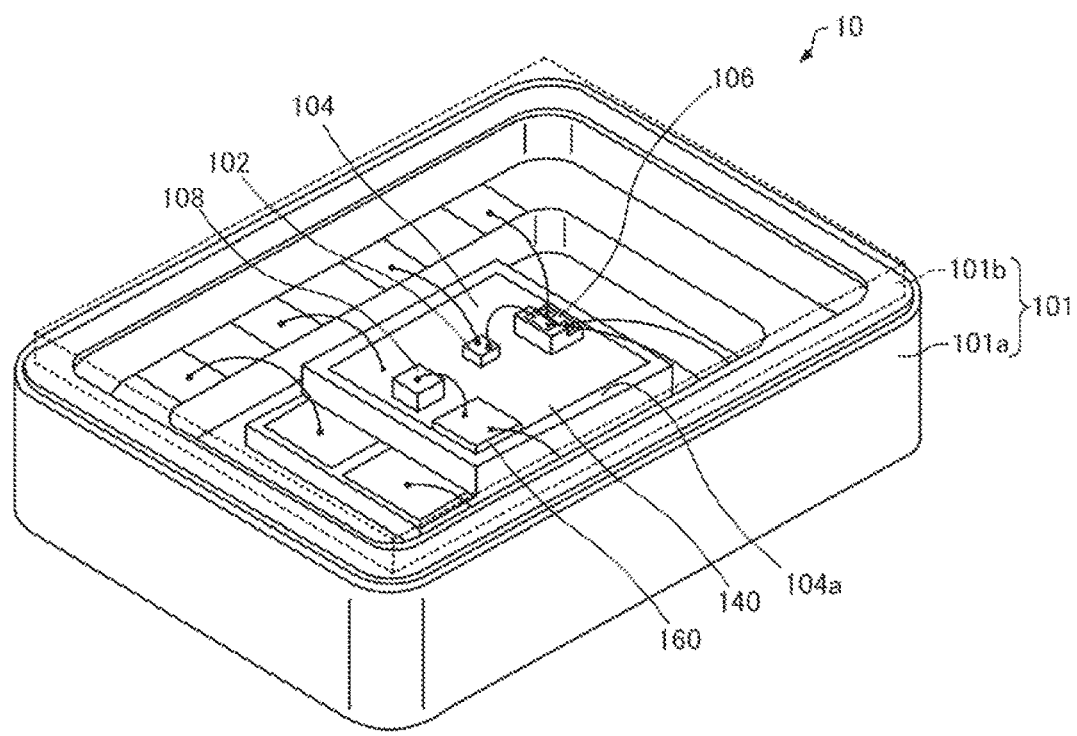
FIG. 8 is a perspective view schematically illustrating a light-emitting device module of an atomic oscillator according to a first modification example.

FIG. 8 is a perspective view schematically illustrating the light-emitting device module 10 of an atomic oscillator according to a first modification example.

In the light-emitting device module 10 of the above-described atomic oscillator 100, as illustrated in FIG. 4, the second temperature control element 106 is disposed on the first surface 4a of the base 101a. On the contrary, in the light-emitting device module 10 of the atomic oscillator according to the first modification example, as illustrated in FIG. 8, the second temperature control element 106 is disposed on the temperature control surface 104a of the first temperature control element 104.

In the example illustrated in FIG. 8, the second temperature control element 106 is disposed on the temperature control surface 104a of the first temperature control element 104 via the metal layer 140. Although not illustrated, the second temperature control element 106 may be directly disposed on the temperature control surface 104a.

The second temperature control element 106 may control the temperature of the first electrode 220 (see FIG. 7) based on the temperature of the temperature control surface 104a by disposing the second temperature control element 106 on the temperature control surface 104a. Thus, it is possible to narrow a temperature control range of the second temperature control element 106. As described above, it is possible to relatively improve temperature control accuracy by narrowing the temperature control range of the second temperature control element 106. Thus, it is possible to realize high temperature control accuracy.

In the atomic oscillator according to the first modification example, similar to the above-described atomic oscillator 100, it is possible to realize an atomic oscillator having excellent frequency stability. Further, in the atomic oscillator according to the first modification example, the second temperature control element 106 and the semiconductor laser 102 are disposed on the temperature control surface 104a of the first temperature control element 104. Therefore, it is possible to narrow the temperature control range of the second temperature control element 106 and to control the temperature of the semiconductor laser 102 with high accuracy. In addition, in the atomic oscillator according to the first modification example, a region in which the second temperature control element 106 is disposed may not be provided on the base 101a. Thus, it is possible to reduce the size of the device.

1.4.2. Second Modification Example

Figure 9:
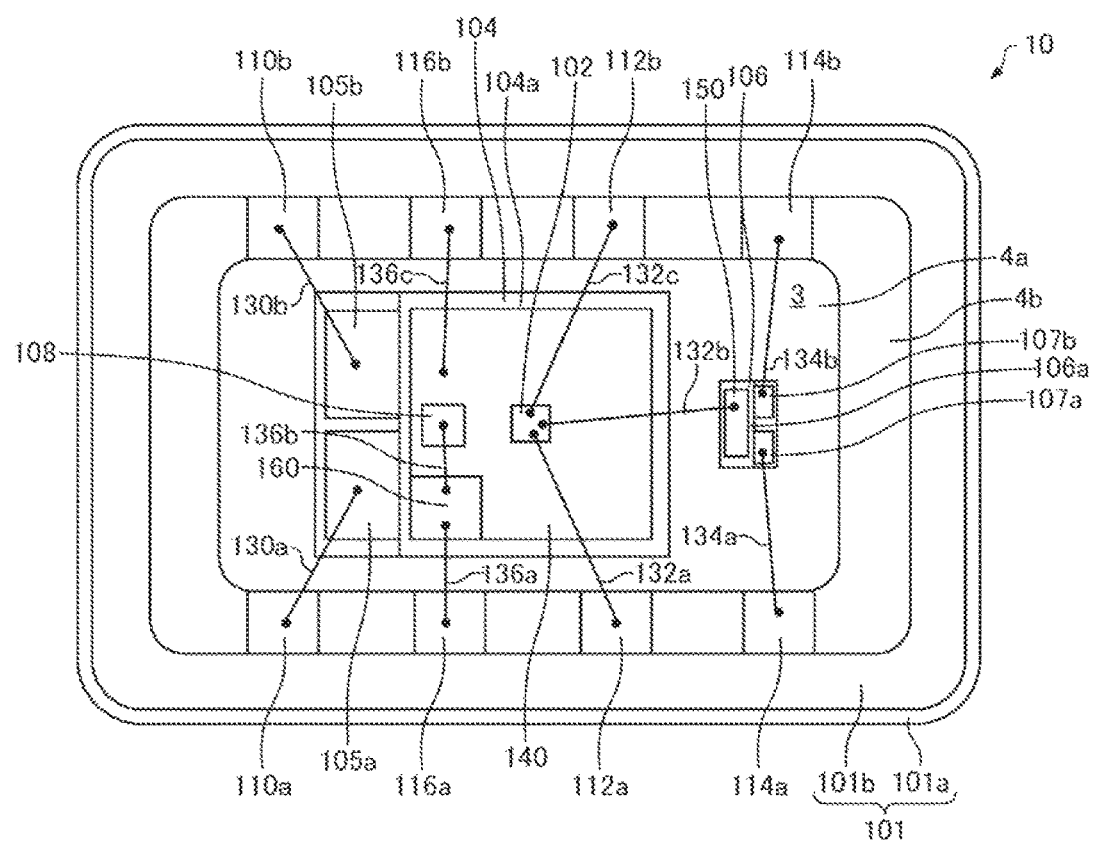
FIG. 9 is a plan view schematically illustrating a light-emitting device module of an atomic oscillator according to a second modification example.
Figure 10:
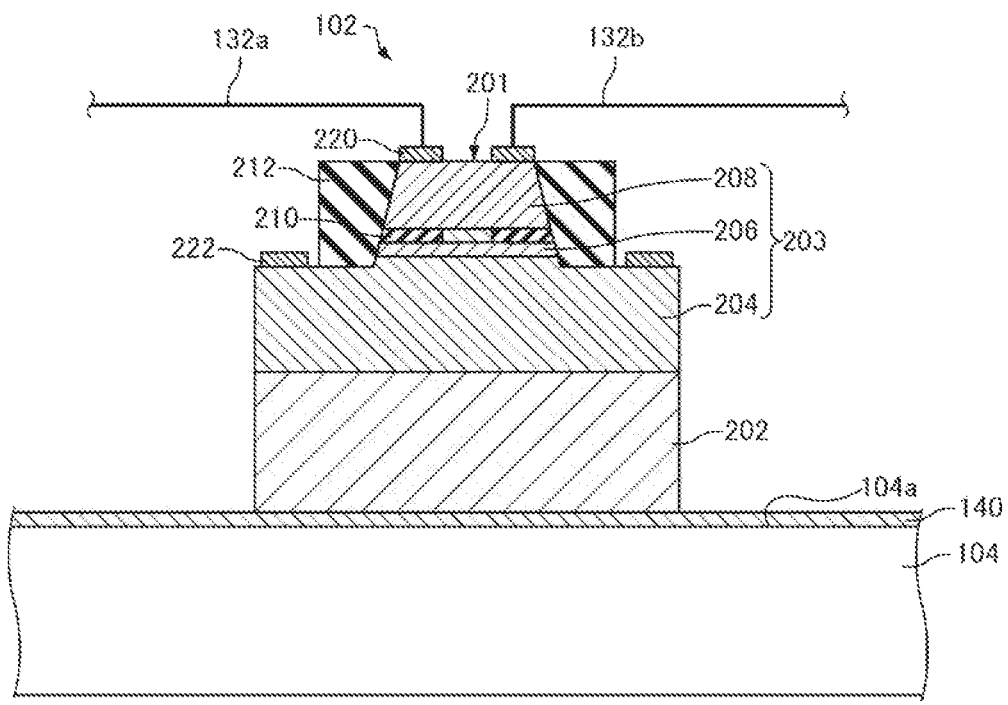
FIG. 10 is a sectional view schematically illustrating the light-emitting device module of the atomic oscillator according to the second modification example.

FIG. 9 is a plan view schematically illustrating the light-emitting device module 10 of an atomic oscillator according to a second modification example. FIG. 10 is a sectional view schematically illustrating the light-emitting device module 10 of the atomic oscillator according to the second modification example.

In the light-emitting device module 10 of the above-described atomic oscillator 100 illustrated in FIGS. 5 and 7, the wiring 132b is connected to the first electrode 220. A current is supplied to the first electrode 220 by the wiring 132b, and heat generated in the second temperature control element 106 is supplied thereto.

On the contrary, in the light-emitting device module 10 of the atomic oscillator according to the second modification example, as illustrated in FIGS. 9 and 10, the wiring 132a for supplying a current from the connection electrode 112a and the wiring 132b for supplying heat generated in the second temperature control element 106 are connected to the first electrode 220. That is, the current is supplied to the first electrode 220 by the wiring 132a, and the heat is supplied thereto by the wiring 132b. Although not illustrated, a plurality of wirings 132b for supplying heat generated in the second temperature control element 106 may be provided.

In the above-described atomic oscillator 100 illustrated in FIGS. 5 and 7, the first electrode 220 functions as the heat transfer member. Although not illustrated, a heat transfer member different from the first electrode 220 may be provided on the second mirror layer 208 in the atomic oscillator according to the second modification example. In this case, the wiring 132a may be connected to the first electrode 220, and the wiring 132b may be connected to this heat transfer member.

In the atomic oscillator according to the second modification example, similar to the above-described atomic oscillator 100, it is possible to realize an atomic oscillator having excellent frequency stability.

2. Frequency Signal Generation System

Figure 11:
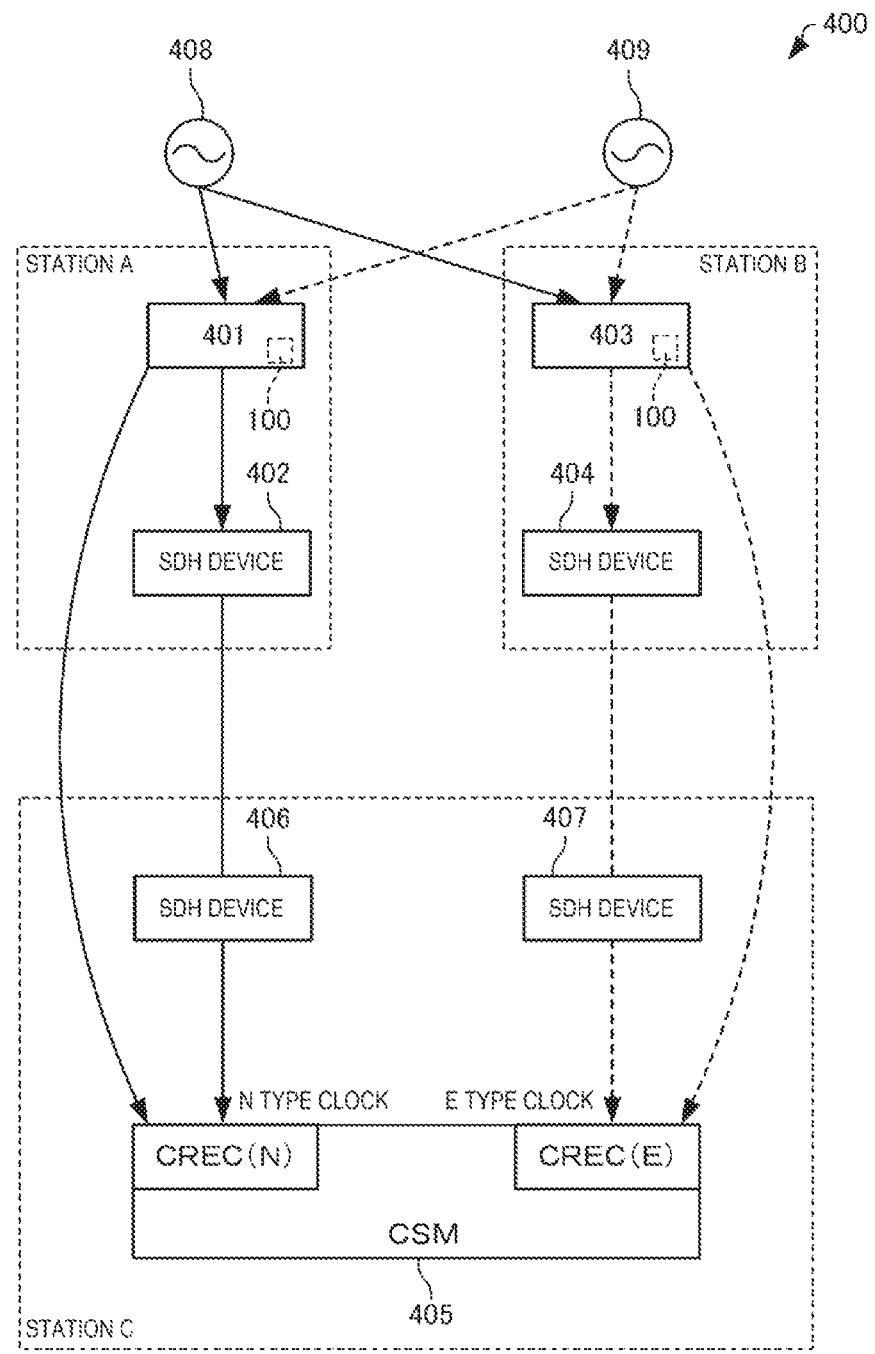
FIG. 11 is a diagram illustrating an example of a frequency signal generation system according to the embodiment.

Next, a frequency signal generation system according to the embodiment will be described with reference to the drawings. A clock transmission system (timing server) as follows is an example of the frequency signal generation system. FIG. 11 is a schematic diagram illustrating a configuration of a clock transmission system 400.

The clock transmission system according to the embodiment includes the atomic oscillator according to the embodiment. The clock transmission system 400 including the atomic oscillator 100 will be described below, as an example.

The clock transmission system 400 matches clocks of devices in a time division multiplexing network with each other. The clock transmission system is a system having a redundant configuration of a normal (N) type and an emergency (E) type.

As illustrated in FIG. 11, the clock transmission system 400 includes a clock supply device 401 and a synchronous digital hierarchy (SDH) device 402 of Station A (higher (N type)), a clock supply device 403 and a SDH device 404 of Station B (higher (E type)), and a clock supply device 405 and SDH devices 406 and 407 of Station C (lower). The clock supply device 401 includes the atomic oscillator 100 and generates an N type clock signal. The atomic oscillator 100 in the clock supply device 401 synchronizes with a clock signal which has high precision and is from master clocks 408 and 409 including an atomic oscillator using cesium and generates a clock signal.

The SDH device 402 transmits and receives a main signal based on the clock signal from the clock supply device 401. In addition, the SDH device 402 superimposes an N type clock signal on the main signal and transmits the resultant of the superimposition to the lower clock supply device 405. The clock supply device 403 includes the atomic oscillator 100 and generates an E type clock signal. The atomic oscillator 100 in the clock supply device 403 synchronizes with a clock signal which has higher precision and is from the master clocks 408 and 409 including the atomic oscillator using cesium and generates a clock signal.

The SDH device 404 transmits and receives a main signal based on the clock signal from the clock supply device 403. In addition, the SDH device 404 superimposes an E type clock signal on the main signal and transmits the resultant of the superimposition to the lower clock supply device 405. The clock supply device 405 receives the clock signals from the clock supply devices 401 and 403. The clock supply device 405 synchronizes with the received clock signal and generates a clock signal.

Normally, the clock supply device 405 synchronizes with the N type clock signal from the clock supply device 401 and generates the clock signal. In a case where the N type signal has a problem, the clock supply device 405 synchronizes with the E type clock signal from the clock supply device 403 and generates the clock signal. As described above, it is possible to guarantee a stable clock supply and to improve reliability of a clock path network, by switching from the N type to the E type. The SDH device 406 transmits and receives a main signal based on the clock signal from the clock supply device 405. Similarly, the SDH device 407 transmits and receives a main signal based on the clock signal from the clock supply device 405. Thus, it is possible to cause the device of Station C to synchronize with the device of Station A or Station B.

The frequency signal generation system according to the embodiment is not limited to the clock transmission system. The frequency signal generation system includes various devices in which the atomic oscillator is mounted, and a frequency signal of the atomic oscillator is used, and a system constituted by a plurality of devices in which the atomic oscillator is mounted, and a frequency signal of the atomic oscillator is used.

Examples of the frequency signal generation system according to the embodiment may include a smartphone, a tablet terminal, a timepiece, a portable phone, a digital still camera, a liquid ejecting apparatus (for example, ink jet printer), a personal computer, a television, a video camera, a video tape recorder, a car navigation device, a pager, an electronic notebook, an electronic dictionary, a calculator, an electronic game device, a word processor, a workstation, a video phone, a television monitor for security, an electronic binocular, a point-of-sales (POS) terminal, medical equipment (for example, electronic thermometer, blood pressure monitor, blood glucose meter, electrocardiogram measuring device, ultrasonic diagnostic device, electronic endoscope, a magnetocardiogram meter), a fish finder, a global navigation satellite system (GNSS) frequency standard, various measuring devices, instruments (for example, instruments of automobiles, aircrafts, ships), a flight simulator, a terrestrial digital broadcasting system, a portable phone base station, and moving objects (automobiles, aircrafts, ships, and the like).

In the invention, some components may be omitted, or the embodiment and the modification examples may be combined, in a range having the features and the effects described in this application.

The invention includes substantially the same configurations as the configuration described in the embodiment (for example, configuration having the same functions, methods, and results or configuration having the same object and effects. The invention includes a configuration in which not-essential parts of the configuration described in the embodiment are replaced. The invention includes a configuration which achieves the same advantageous effects as the configuration described in the embodiment or a configuration which can achieve the same object. The invention includes a configuration in which well-known technologies are added to the configuration described in the embodiment.

What is claimed is:

1. An atomic oscillator comprising:
    a semiconductor laser that includes
        a first mirror layer,
        a second mirror layer,
        an active layer disposed between the first mirror layer and the second mirror layer, and
        a heat transfer member disposed on the second mirror layer;
    an atomic cell which is irradiated with light emitted from the semiconductor laser and in which an alkali metal atom is accommodated;
    a light receiving element that detects intensity of light transmitted through the atomic cell and outputs a detection signal;
    a first temperature control element that controls a temperature of the semiconductor laser;
    a temperature sensor; and
    a second temperature control element which is controlled based on the detection signal and is connected to the heat transfer member,
    wherein the first temperature control element is controlled based on an output of the temperature sensor.

2. The atomic oscillator according to claim 1,
    wherein the second mirror layer is disposed on the active layer, and
    the heat transfer member is disposed on an upper surface of the second mirror layer.

3. The atomic oscillator according to claim 1,
    wherein the heat transfer member is an electrode that causes a current to flow into the active layer.

4. The atomic oscillator according to claim 2,
    wherein the heat transfer member is an electrode that causes a current to flow into the active layer.

5. The atomic oscillator according to claim 3,
    wherein the heat transfer member is connected to the second temperature control element by a wiring for supplying a current to the heat transfer member.

6. The atomic oscillator according to claim 1,
    wherein the second temperature control element and the semiconductor laser are disposed on a temperature control surface of the first temperature control element.

7. The atomic oscillator according to claim 1, further comprising:
    a container that accommodates the semiconductor laser, the first temperature control element, and the second temperature control element,
    wherein the first temperature control element and the second temperature control element are disposed at positions different from each other in the container.

8. A frequency signal generation system comprising:
    an atomic oscillator includes
        a semiconductor laser that includes
            a first mirror layer,
            a second mirror layer,
            an active layer disposed between the first mirror layer and the second mirror layer, and
            a heat transfer member disposed on the second mirror layer,
        an atomic cell which is irradiated with light emitted from the semiconductor laser and in which an alkali metal atom is accommodated,
        a light receiving element that detects intensity of light transmitted through the atomic cell and outputs a detection signal,
        a first temperature control element that controls a temperature of the semiconductor laser,
        a temperature sensor, and
        a second temperature control element which is controlled based on the detection signal and is connected to the heat transfer member, wherein the first temperature control element is controlled based on an output of the temperature sensor.

* * * * *